United States Patent [19]

Murano et al.

[11] 4,398,208

[45] Aug. 9, 1983

[54] INTEGRATED CIRCUIT CHIP PACKAGE FOR LOGIC CIRCUITS

[75] Inventors: Hiroshi Murano; Moritoshi Akino, both of Tokyo, Japan

[73] Assignee: Nippon Electric Co., Ltd., Tokyo, Japan

[21] Appl. No.: 168,226

[22] Filed: Jul. 10, 1980

[30] Foreign Application Priority Data

Jul. 10, 1979 [JP] Japan ................... 54-87022

[51] Int. Cl.³ ............... H01L 23/52; H01L 23/36; H01L 23/04; H01L 23/12

[52] U.S. Cl. .................. 357/81; 357/72; 357/74; 357/80; 174/52 H

[58] Field of Search ........... 174/52 PE, 52 S, 52 H, 174/50.51; 357/74, 80, 81, 72

[56] References Cited

U.S. PATENT DOCUMENTS

| | | | |
|---|---|---|---|
| 3,202,888 | 8/1965 | Evander et al. | 357/74 |
| 3,311,798 | 3/1967 | Gray | 357/74 |
| 3,361,868 | 1/1968 | Bachman | 357/14 |
| 3,373,322 | 3/1968 | Hillman et al. | 357/74 |
| 3,404,214 | 9/1968 | Elliot | 357/74 |
| 3,404,215 | 9/1968 | Burks et al. | 357/74 |
| 3,423,638 | 1/1969 | Dix et al. | 357/74 |
| 3,496,634 | 2/1970 | Kurtz et al. | 357/74 |
| 3,519,895 | 7/1970 | Marino et al. | 357/74 |
| 3,649,881 | 3/1972 | Chang et al. | 357/80 |
| 4,220,917 | 9/1980 | McMahon, Jr. | 357/70 |

OTHER PUBLICATIONS

*Electronics*, vol. 52, No. 4, Feb. 15, 1979, Anthony Durniak "IBM Has a Message: The 4300", pp. 85-86.
*IEEE Transactions on Computers*, vol. C-20, No. 12, Bernard S. Landman and Roy L. Russo, "On a Pin Versus Block Relationship for Partitions of Logic Graphs", pp. 1469-1479.

*Primary Examiner*—Andrew J. James
*Assistant Examiner*—E. D. Burnside
*Attorney, Agent, or Firm*—Sughrue, Mion, Zinn, Macpeak, and Seas

[57] ABSTRACT

An integrated circuit (IC) chip package comprises a plurality of IC chips mounted on a multilayer substrate. A plurality of covers are provided on the substrate and are positioned so as to cover at least one of the IC chips. External pins are provided on each of the covers, and each of the pins is connected to selected chips via first signal lines on the covers connecting the pins to the substrate, and second signal lines within the substrate connecting the first signal lines to the selected chips. The substrate may be provided with a heat exchanger or heat sinks at the underside thereof, the overall construction resulting in a cool operating IC chip package with numerous external terminals having short wiring lengths to the chips.

7 Claims, 9 Drawing Figures

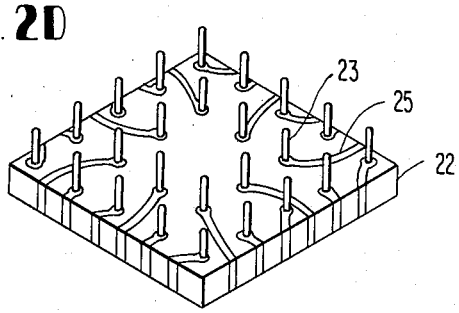
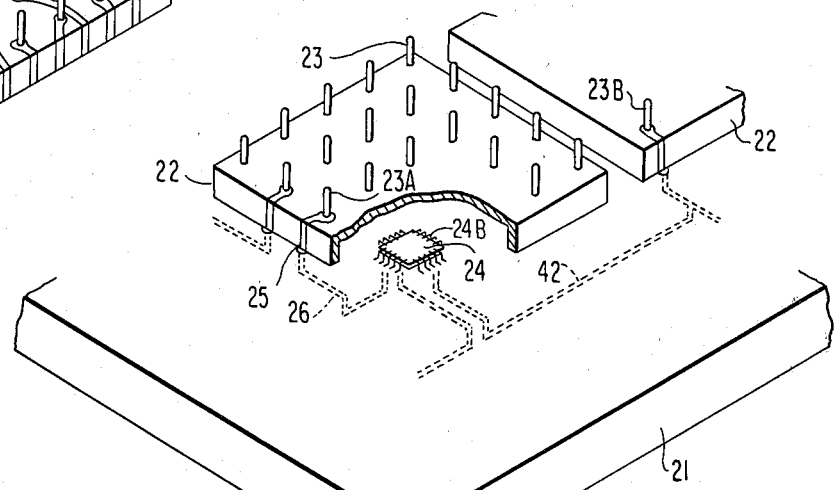
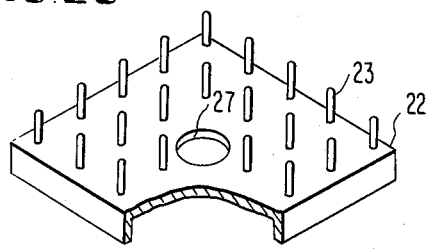
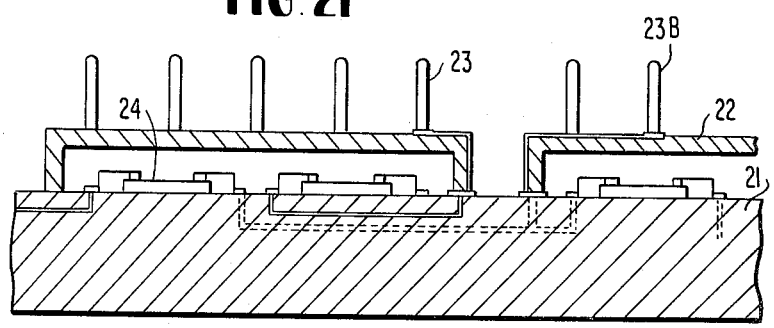
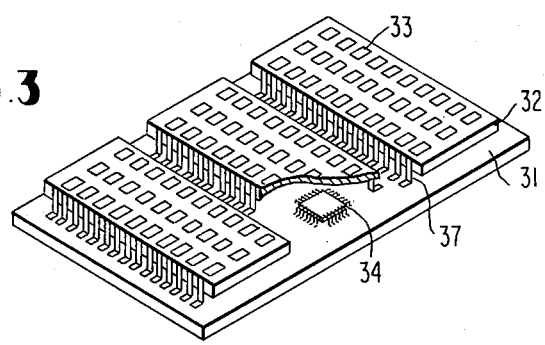

INTEGRATED CIRCUIT CHIP PACKAGE FOR LOGIC CIRCUITS

BACKGROUND OF THE INVENTION

This invention relates to an integrated circuit chip package (IC package) for logic circuits for use in information processing and communication systems.

IC packages for logic circuits have been developed in order to achieve higher speed devices in many fields, particularly, in an information processing system. As a result, IC packages carrying a plurality of IC chips on a substrate with a multilayer structure have been put into practical use. As examples of such IC packages, reference is made to a paper by Anthony Durniak in *Electronics*, entitled "IBM has a message: the 4300" on pp. 85-86, Feb. 15, 1979 and to FIG. 3 of Japanese Patent Application Disclosure No. 8096/1980 corresponding to U.S. Application No. 920,914 filed June 30, 1978. Each of these conventional IC chip packages comprises a plurality of chips mounted on a substrate with a multilayer structure and a plurality of input/output terminals for external connection provided on the rear of the substrate. With such a package, however, a plurality of signal lines must be disposed through the substrate for connection of the chips to the terminals, resulting in a complicated structure requiring an intricate manufacturing method. Also, since it is difficult to provide a structure to permit heat generated from the chips to be discharged from the under-surface of the substrate, a cooling mechanism must be equipped to discharge the heat from the upper surface. As a result, sufficient heat discharge cannot be achieved with the conventional IC package.

SUMMARY OF THE INVENTION

One object of the present invention is to provide an IC package free from the above-mentioned disadvantages.

According to one aspect of the present invention, there is provided an IC package which comprises: a substrate; a plurality of IC chips, each having a plurality of lead terminals on the upper surface thereof and provided on the surface of the substrate; at least one cover provided on the substrate surface and having a concave rectangular bracket-shaped cross section so as to cover at least one of the chips; a plurality of external terminals formed on the upper surface of said cover; a plurality of first signal lines electrically connected to each of the external terminals and positioned independently on the upper surface and the sides of said cover; and a plurality of second signal lines for electrically connecting each of the plurality of terminals provided on each of the upper surfaces of said chips with each of the first signal lines.

BRIEF DESCRIPTION OF THE DRAWINGS

The present invention will be described in greater detail referring to the drawings wherein:

FIGS. 2A to 2G show a first embodiment of the present invention;
and
FIG. 3 shows a second embodiment of the present invention.

In the drawings, the same reference numerals denote the same structural elements.

DETAILED DESCRIPTION OF THE INVENTION

Figure 1:
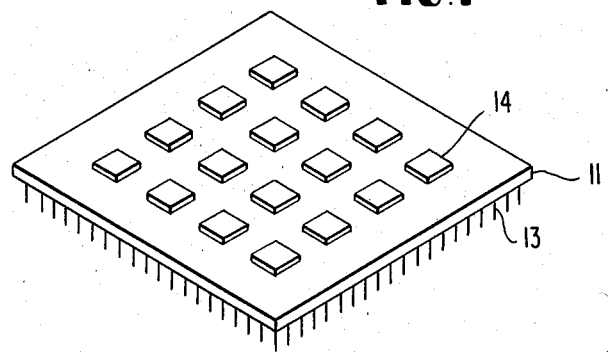
FIG. 1 shows a prior art IC package.

Referring to FIG. 1, the conventional IC package includes a plurality of chips 14 mounted on a ceramic substrate 11 with a multilayer structure, and a plurality of connection pins 13 are provided on the rear surface of the substrate. The substrate 11 with the multilayer structure consists of two conductive layers and an insulating layer inserted between the conductive layers. All of the pins 13 are positioned within an area of $10 \times 10$ cm$^2$ (square centimeters) equal to the area of the rear surface of the substrate at intervals of 2.54 mm (millimeters) so that a total of $40 \times 40 = 1,600$ pins can be formed on the rear of the package. However, the wiring structure and method of fabricating this package are quite complex.

Figure 2A:
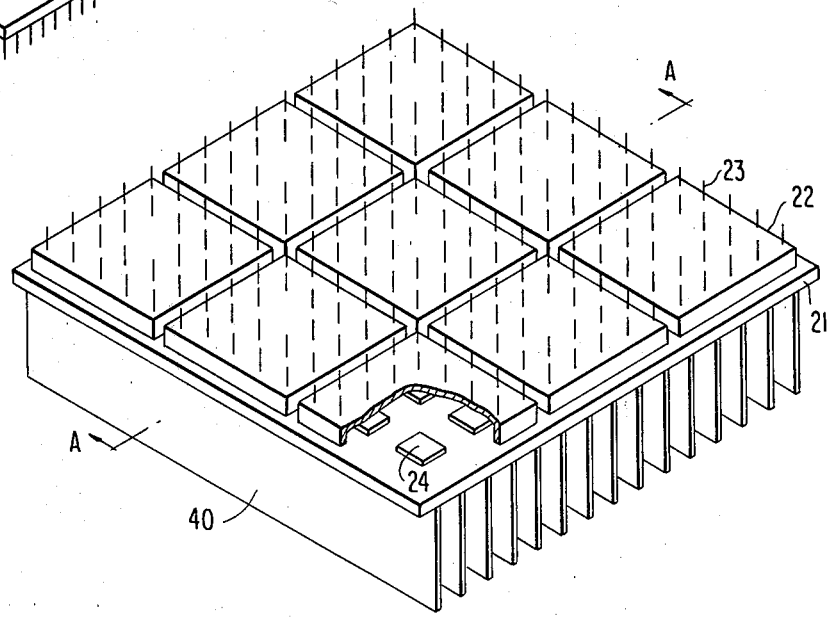

Referring to FIG. 2A, a first embodiment of the present invention comprises an alumina-ceramic substrate 21 with a multilayer structure similar to that of the substrate 11 of FIG. 1; a plurality of chips 24 mounted on said substrate 21, each having a size of $3 \times 3$ mm$^2$ to $5 \times 5$ mm$^2$; a plurality of alumina-ceramic covers 22, each having a size of $13 \times 13$ mm$^2$; and a plurality of external connections pins 23 formed on the cover consisting of nickel, cobalt, and iron.

The pins 23 are electrically connected to signal lines 26, FIG. 2E, formed in the substrate 21 through signal lines 25, FIG. 2D, formed on the upper surfaces of each of the covers 22. Twenty-four pins 23 are provided on each of the covers 22. A single cover may be used in lieu of the plurality as shown.

Figure 2B:
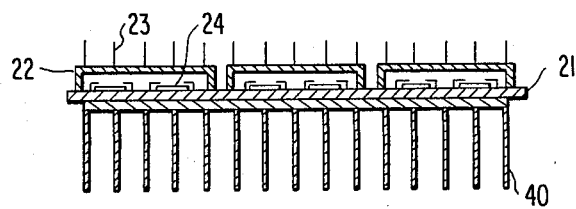

FIG. 2B shows a cross-sectional view taken along A-A' in FIG. 2A. As shown, the pins 23 on each of the covers 22 may be positioned in an approximately uniform fashion on the surface of the substrate 21. The heat generated from each of the chips 24 may be discharged from the under-surface of the substrate 21 using aluminum or copper heat sinks 40 for air cooling.

Figure 2C:
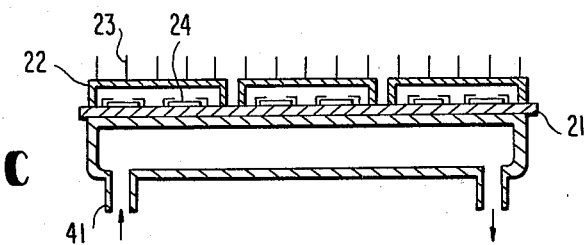

Referring to FIG. 2C, other cooling means may be provided such as a heat exchanging unit 41 for liquid cooling made of aluminum or copper to allow cooled liquid to pass in the direction indicated by the arrows. The liquid is circulated within the unit, thereby discharging the heat from the chips 24 from the under-surface of the substrate 21.

Referring to FIG. 2D, the signal lines 25 formed on each of the covers 22 are formed by molybdenum or tungsten using a printing technique. Each of the lines 25 is electrically connected to the pins 23 and to the signal lines 26 (shown in FIG. 2E).

Each of the covers 22 shown in FIG. 2D is mounted on the substrate 21 as shown in FIG. 2A by a soldering process, so that the connection of the signal lines 25 and 26 may be achieved as well as the protection of the chips.

Referring to FIGS. 2E and 2F, for the electrical connections of the cover 22 and the substrate 21, the pin 23A in FIG. 2E of the cover 22 is connected to the chip 24 via the signal line 25 of the cover 22 and the signal lines 26. The chip terminal 24B in FIG. 2E is further connected to the external connection pin 23B of the other cover 22 via the signal lines 42 in the substrate 21. Remaining pins of the cover 22 may be connected to the chips (not shown) provided under the other cover 22.

The wiring pattern of the substrate 21 is formed by integrating a thick insulating film and a thin metal film by the use of a sputtering, plating, or etching method.

Referring to FIG. 2G, another example of the cover 22 has a hole 27 on the upper surface thereof. The chip 24 (FIG. 2E) can be washed with a liquid solvent through the hole 27 after being mounted on the substrate 21 (FIG. 2E) to remove soldering flux or the like which inevitably results from the chip mounting process. Also, a material such as resin can be stuffed into the hole to protect the chip.

Generally, the number of output pins is related to the number of all the circuits actually provided on the substrate. As discussed in a paper entitled "On a Pin Versus Block Relationship For Partitions of Logic Graphs," IEEE Transactions on Computers, Vol. C-20, No. 12, pp. 1469–1479, December 1971, the above-mentioned relation is considered to substantially follow the empirical rule called Rent's Rule:

$$P = KB^r \quad (1)$$

wherein
P is the number of pins required,
K is a constant,
B is the number of circuits,
r is a constant, generally assuming a value ranging from 0.57 to 0.75.

Assuming now that the numbers of pins and circuits used for each chip are the same, the following formula (2) is established:

$$P_T = \frac{K(nNB_{IC})^r}{N} \quad (2)$$

$$= \frac{nKB_{IC}^r}{(nN)^{1-r}}$$

where $P_T$ is the number of external pins 23 required per one cover, $P_{IC}$ is the number of pins provided on one chip, $B_{IC}$ is the number of circuits per chip, n is the number of chips covered by one cover, and N is the number of covers provided on the substrate.

On the other hand, the total number $P_{AT}$ of pins provided on chips to be covered by one cover is obtained by the formula:

$$nP_{IC} = nKB_{IC}^r \quad (3)$$

Therefore, the number $P_T$ of pins per cover is equal to $1/(nN)^{1-r}$ times the number $P_{AT}$. Specifically, $$1/(nN)^{1-r} = 1/36^{0.4} = 1/4.2$$

wherein n=4, N=9, r=0.6. This indicates that the number of the required pins is very small with the present invention.

Referring to FIG. 3, the second embodiment comprises an alumina-ceramic substrate 31, with a multilayer structure similar to that of the substrate 21 of FIG. 2, a plurality of chips 34 mounted on the substrate 31, and a plurality of terminal pads 33 provided on one surface of planar covers 32. The terminal pads 33 are electrically interconnected with the circuits provided on the substrate 31 not by using the four sides of the cover as shown in the first embodiment, FIG. 2D, but on the two sides of each terminal pad 33. In other words, the terminal pads 33 are connected to the substrate 31 via the leads 37 provided there previously.

The substrate 21 and 31 used in the embodiments may be composed of one conductive layer.

As mentioned above, the IC chip package of the present invention is capable of discharging a great deal of heat without decreasing the chip-integration area on the substrate, and is further capable of forming numerous external terminals having shorter wiring lengths to the chips.

One skilled in the art will appreciate that various changes or modifications can be made without departing from the spirit and scope of the invention.

What is claimed is:

1. An integrated circuit (IC) chip package for logic circuits comprising:
   a substrate;
   a plurality of IC chips mounted on the surface of the substrate;
   at least one cover provided on said substrate surface, said cover having a concave rectangular bracket-shaped cross section and positioned so as to cover at least one of said IC chips;
   a plurality of external terminals formed on the upper surface of said cover;
   a plurality of first signal lines electrically connected to each of the external terminals and positioned independently on said cover; and
   a plurality of second signal lines for electrically connecting selected first signal lines to selected IC chips, said at least one cover comprising at least first and second covers each covering different ones of said plurality of IC chips, at least one of said second signal lines being embedded in said substrate and electrically connecting an IC chip under said first cover with a first signal line on said second cover.

2. An IC chip package for logic circuits as claimed in claim 1, further comprising heat sink means provided on the underside of said substrate for air cooling said IC chip package.

3. An IC chip package for logic circuits as claimed in claim 1, further comprising heat exchanger means provided on the underside of said substrate for liquid cooling said IC chip package.

4. An IC chip package for logic circuits as claimed in claim 1, wherein said substrate has a multilayer structure composed of two insulating layers and a conductive layer inserted between said insulating layers, said conductive layer forming said at least one plurality of said second signal lines.

5. An IC chip package for logic circuits as claimed in claim 1, wherein the upper surface of at least one of said first and second covers is provided with a hole bored therethrough.

6. An IC chip package for logic circuits as claimed in claim 1, wherein said plurality of external terminals are pin-type terminals.

7. An IC chip package for logic circuits as claimed in claim 1, wherein said plurality of external terminals are pad-type terminals.

* * * * *